(12) United States Patent
Neumann et al.

(10) Patent No.: US 9,704,907 B1
(45) Date of Patent: Jul. 11, 2017

(54) DIRECT READ PIXEL ALIGNMENT

(71) Applicant: Raytheon Company, Waltham, MA (US)

(72) Inventors: Jay R. Neumann, Goleta, CA (US); Peter M. Randolph, Goleta, CA (US); Chad W. Fulk, Ventura, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 15/094,505

(22) Filed: Apr. 8, 2016

(51) Int. Cl.
*H01L 27/14* (2006.01)
*H01L 27/146* (2006.01)

(52) U.S. Cl.
CPC .... *H01L 27/14634* (2013.01); *H01L 27/1469* (2013.01); *H01L 27/14636* (2013.01); *H01L 27/14685* (2013.01); *H01L 27/14687* (2013.01)

(58) Field of Classification Search
CPC .............. H01L 27/14; H01L 27/14643; H01L 27/14609; H01L 27/1463; H01L 27/14603; H01L 27/14632

USPC ......................................................... 257/444
See application file for complete search history.

(56) References Cited

U.S. PATENT DOCUMENTS

| | | |
|---|---|---|
| 5,812,629 A | 9/1998 | Clauser |
| 7,709,775 B2 * | 5/2010 | Konno .............. H01L 27/14643 250/208.1 |
| 7,841,537 B2 | 11/2010 | Starling et al. |
| 8,471,204 B2 | 6/2013 | Bornfreund |
| 8,610,070 B2 | 12/2013 | Schimert et al. |
| 8,691,614 B2 | 4/2014 | Smith |
| 2011/0049661 A1 * | 3/2011 | Maehara ............... H01L 27/307 257/432 |
| 2013/0278804 A1 | 10/2013 | Denham et al. |

* cited by examiner

*Primary Examiner* — Monica D Harrison
(74) *Attorney, Agent, or Firm* — Cantor Colburn LLP

(57) ABSTRACT

An electro-optical sensor chip assembly (SCA) is provided and includes a read-out integrated circuit (ROIC), a detector including a substrate, a buffer layer, a pixel layer and an array of pixels disposed in the pixel layer and an interconnect layer interposed between the ROIC and the pixel layer and comprising cold welded interconnect posts respectively extendible to the ROIC from the pixels. The detector is penetrable by visible wavelength light propagating from a direct view window formed in the substrate and the buffer layer to one or more of the pixels.

18 Claims, 11 Drawing Sheets

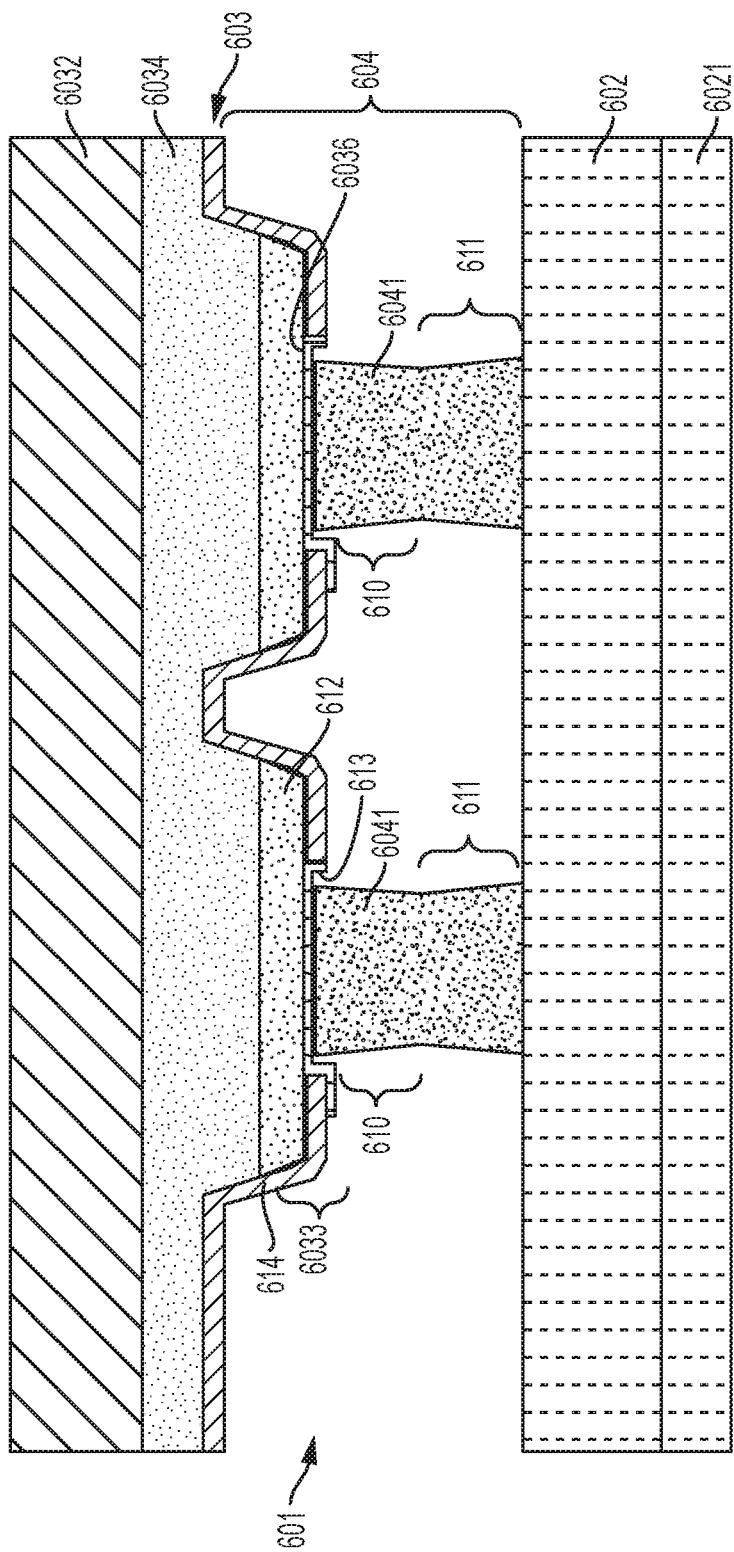

DIRECT READ PIXEL ALIGNMENT

BACKGROUND

The present disclosure relates to an electro-optical detector element and to a method of directly reading pixels for alignment purposes.

Over the last few years, electro-optical sensors have been developed that incorporate increasingly higher resolution detectors which, in turn, require systems with higher and higher precision in alignment and pixel co-registration. Indeed, sensor optical systems are now requiring alignment of filters and pixel co-registration to resolutions of less than about 2 microns in order to meet performance requirements.

Current alignment techniques have significant error in alignment at multiple assembly stages relative to the tighter tolerances now required. These stages include detector hybridization stages, sensor chip assembly (SCA) stages, bonding filter alignment stages and optical system alignment stages as well as detector-to-detector alignment stages. Inherent and significant tolerance stack-up issues include, for example, problems with placement accuracies of a read-out integrated circuit (ROIC) relative to a detector during SCA bonding. Such accurate placement requires both precise location and measurement knowledge that can be difficult to obtain. If alignment operations are performed at the electro-optical sensor level, the alignment operations become critical path activities and often require multiple iterations to complete. In some cases, the iterations include cooling operations for focal planes to evaluate the alignment accuracies which result in high cost and significant schedule impact on sensor level integration using iterative alignment methods.

At best, even with the delays and costs associated with alignment operations, current alignment techniques have hybridization errors (e.g., about 4-8 microns), SCA alignment errors, or filter alignment errors (about 20 microns) and total alignment errors (about 25 microns).

SUMMARY

According to one embodiment, an electro-optical detector element is provided and includes an integrated circuit (IC), a detector comprising a substrate, a buffer layer, a pixel layer and an array of pixels disposed in the pixel layer and an interconnect layer interposed between the IC and the pixel layer and comprising cold welded interconnect posts respectively extendible to the IC from the pixels. The detector is penetrable by visible wavelength light propagating from a direct view window formed in the substrate and the buffer layer to one or more of the pixels.

According to another embodiment, a method of forming an electro-optical detector element. The method includes assembling a detector comprising a substrate, a buffer layer, a pixel layer and an array of pixels disposed in the pixel layer, interposing an interconnect layer between an integrated circuit (IC) and the pixel layer, hybridizing the IC and the detector whereby interconnect posts respectively extendible to the IC from the pixels are cold welded, forming a direct view window in the substrate and the buffer layer at a location of one or more of the pixels and propagating visible wavelength light from the direct view window to the one or more of the pixels.

According to another embodiment, a method of assembling an electro-optical detector is provided. The method includes characterizing a position of an optical element relative to a pedestal, conducting direct read pixel alignment of an electro-optical detector element, disposing the electro-optical detector element on the pedestal and aligning the electro-optical detector element relative to the optical element based on the characterized position and the direct read pixel alignment.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts:

FIG. 6A is a cross-sectional view of an electro-optical sensor chip assembly at an initial assembly stage in accordance with embodiments;

DETAILED DESCRIPTION

As will be discussed below, errors associated with hybridization of a detector with an integrated circuit (IC) element, such as a read-out integrated circuit (ROIC), for example, are eliminated or substantially reduced. This is achieved by the removal of infrared detector substrates by diamond point turning (DPT) machining methods and/or etching methods to expose the pixel structure of the detector and to allow for visible light inspection using an alignment scope that is inherently more accurate by a factor greater than 10 times due to the shorter wavelength of visible light as compared to what would be possible with infrared (IR) detection scope.

Figure 1:
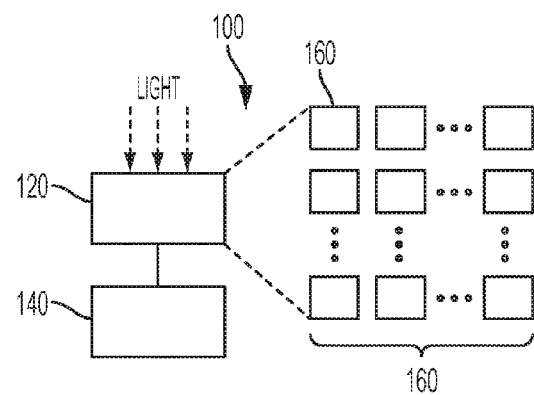
FIG. 1 is a schematic diagram illustrating an image detector in accordance with embodiments.

FIG. 1 is a schematic diagram illustrating an image detector 100 in accordance with embodiments. Image detector 100 may be a focal plane array (FPA), active pixel sensor (APS) or any other suitable energy wavelength sensing device. The image detector 100 may be used as a component of a photographic and/or image capturing device, such as a digital camera, video camera or other similar device. The image detector 100 may include detection device 120 and ROIC 140.

The detection device 120 includes an array of photosensitive/energy wavelength sensitive detector unit cells 160 arranged in an X×Y matrix. Each of the detector unit cells 160 may accumulate charge or produce a current and/or voltage in response to light incident upon the detector unit cell 160 and may correspond to a pixel in a captured electronic image. One or more of the detector unit cells 160 may include a photovoltaic detector (e.g., a photovoltaic single absorber detector or a photovoltaic multi-absorber (multi-junction) detector), a barrier device detector, a position sensitive detector (PSD) or other suitable detector. The detector unit cells 160 may include any suitable materials, dopant concentrations, number of layers, layer thicknesses and/or other characteristics selected based on the type of photodetector.

The ROIC 140 may be used for processing of the incident light (e.g., to create an image representative of the incident light). For example, the integrated circuit 140 interfaces with detection device 120 to receive a signal, such as the accumulated charge or the current and/or voltage produced in response to light incident upon the detector unit cells 160. The integrated circuit 140 may include an image processing unit and may include a combination of hardware, software, or firmware that is operable to convert the received signal into an electronic image.

The integrated circuit 140 may include an array of ROIC unit-cells that are arranged in an X×Y matrix corresponding to the chiral orientation of the X×Y matrix of the detector unit cells 160. Thus, each ROIC unit-cell may be interconnected with a corresponding detector unit cell 160 by way of one or more direct bond interconnects, such as direct metal-to-metal interconnects or indium interconnects. The interconnections may be made at the wafer level or at the die level. In the former case, the interconnections may be made by providing the array of ROIC unit-cells as a ROIC wafer and the array of detector unit cells 160 as a detector wafer and hybridizing by pressurization or squeezing of the ROIC wafer and the detector wafer to fuse the two together. While the use of wafers may allow for efficient manufacture of image detector 100, the hybridization of the ROIC wafer and the detector wafer can lead to the interconnections being effectively cold welded and to shear stresses being applied to the interconnections as will be discussed below.

Figure 2:
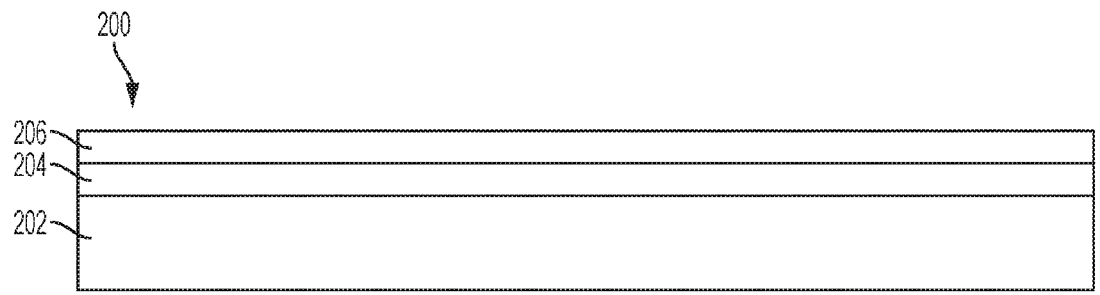
FIG. 2 is a cross-sectional view of a semiconductor substrate prior to post-processing to form a unit cell in accordance with embodiments.

With reference to FIG. 2, a cross-sectional view of a semiconductor substrate 200 prior to post-processing to form detector unit cell 160 is provided in accordance with embodiments. The semiconductor substrate 200 may include a barrier layer or device, such as a minority carrier isotype device or a heterojunction device. The barrier layer may be formed of cadmium zinc tellurium, germanium, silicon carbide, aluminum arsenide antimonide, gallium antimonide, gallium arsenide, gallium nitride, gallium phosphide, indium antimonide, indium arsenide, indium arsenide antimonide, indium gallium arsenide, indium nitride, indium phosphide, mercury cadmium tellurium, silicon germanium, or other suitable semiconductor material.

The semiconductor substrate 200 may further include an absorber layer 202, a separation layer 204 and a contact layer 206. The various layers of the semiconductor substrate 200 may be grown on a base substrate. The base substrate may comprise any substantially intrinsic semiconductor substrate (e.g., purely intrinsic or very lightly-doped), including without limitation silicon, cadmium zinc tellurium, germanium, silicon carbide, aluminum arsenide antimonide, gallium antimonide, gallium arsenide, gallium nitride, gallium phosphide, indium antimonide, indium arsenide, indium arsenide antimonide, indium gallium arsenide, indium nitride, indium phosphide, mercury cadmium tellurium, silicon germanium, or other suitable semiconductor material. The material or materials used for the base substrate may be selected based on desired characteristics for a unit cell to be fabricated from semiconductor substrate 200.

The absorber layer 202 may be operable to absorb incident photons such that the absorbed photons excite positive and negative charges in the absorber layer 202. The absorber layer 202 may include any substantially doped semiconductor substrate (e.g., dopant concentration between approximately $2\times10^{14}$ cm$^{-3}$ and approximately $5\times10^{17}$ cm$^{-3}$), including, without limitation, the semiconductors set forth above with respect to the base substrate. The absorber layer 202 may be an n-type semiconductor, a p-type semiconductor or an intrinsic semiconductor. The material or materials used for absorber layer 202 may be selected based on desired characteristics for the unit cell (e.g., a material may be selected with a bandgap suitable for photon absorption and thus light detection of a particular wavelength or range of wavelengths). The absorber layer 202 may be grown to a thickness of between approximately 1.0 µm and approximately 25.0 µm (e.g., to ensure absorber layer 202 is sufficiently thick to capture light of a particular intensity yet thin enough to collect photo-generated charge carriers).

The separation layer 204 may include a barrier layer, a junction layer or other suitable layer operable to receive charged carriers from the absorber layer 202 and to separate first charged carriers for collection at a first contact from second charged carriers for collection at a second contact. The first charged carriers may be charges having a first or positive polarity and the second charged carriers may be charges having a second or negative polarity (e.g., a polarity opposite that of the first charged carriers). The separation layer 204 may include any doped or undoped semiconductor, including without limitation the semiconductors set forth above with respect to the base substrate. The dopant concentration may be between approximately $2\times10^{14}$ cm$^{-3}$ and approximately $5\times10^{17}$ cm$^{-3}$. The separation layer 204 may include the same type of doping as the absorber layer 202 (e.g., both n-type or both p-type). For example, certain barrier devices may use the same type of doping in the absorber layer 202 and the separation layer 204. Alternatively, separation layer 204 may include a different type of doping than the absorber layer 202 (e.g., absorber layer 202 may include n-type doping and separation layer 204 may include p-type doping or vice versa). For example, junction devices and certain barrier devices may use opposite doping in the absorber layer 202 and the separation layer 204. The separation layer 204 may be grown to a thickness of between approximately 0.05 μm and approximately 2.0 μm. The material or materials used for the separation layer 204, the dopant concentration of the separation layer 204, the thickness of the separation layer 204 and/or other physical characteristics of the separation layer 204 may be selected based on desired characteristics for the unit cell.

The contact layer 206 may be coupled to one or more direct bond interconnects and each direct bond interconnect may be operable to conduct charged carriers to ROIC 140. The contact layer 206 may include any highly-doped semiconductor substrate (e.g., dopant concentration between approximately $1 \times 10^{16}$ cm$^{-3}$ and approximately $5 \times 10^{18}$ cm$^{-3}$), including without limitation the semiconductors set forth above with respect to the base substrate. The contact layer 206 may include the same type of doping as the absorber layer 202 (e.g., both n-type or both p-type). Alternatively, the contact layer 206 may include a different type of doping than the absorber layer 202 (e.g., the absorber layer 202 may include n-type doping and the contact layer 206 may include p-type doping or vice versa). The contact layer 206 may be grown to a thickness of between approximately 0.1 μm and approximately 3.0 μm. The material or materials used for the contact layer 206, the dopant concentration of the contact layer 206, the thickness of the contact layer 206 and/or other physical characteristics of the contact layer 206 may be selected based on desired characteristics for the unit cell. For example, certain physical characteristics may be selected based on a desired resistivity for the contact layer 206.

As described above, the materials for each layer may be selected based on desired characteristics of the unit cell. In certain embodiments, the layers may comprise III-V materials. The III-V materials may include at least a first element found in group III of the periodic table and a second element found in group V of the periodic table. Group III elements may have three electrons in their outer-most electronic shell; examples include boron, aluminum, gallium, indium, and thallium. Group V elements may have five electrons in their outer-most electronic shell; examples include nitrogen, phosphorus, arsenic, antimony, and bismuth. The III-V materials may be well-suited to withstanding the high temperatures associated with interconnecting the unit cell and integrated circuit 140 with a direct bond interconnect. In certain embodiments, the III-V materials may include gallium antimonide in the base substrate, indium arsenide antimonide in absorber layer 202 and contact layer 206, and aluminum arsenide antimonide in separation layer 204. In certain embodiments, materials comprising antimonide or mercury cadmium tellurium may be well-suited to a unit cell designed to detect infrared light. In certain embodiments, materials comprising indium gallium arsenide or silicon germanium may be well-suited to a unit cell designed to detect visible light.

After one or more of the various layers described above have been formed, the semiconductor substrate 200 may be used to fabricate one or more unit cells, as described in greater detail below.

Figure 3:
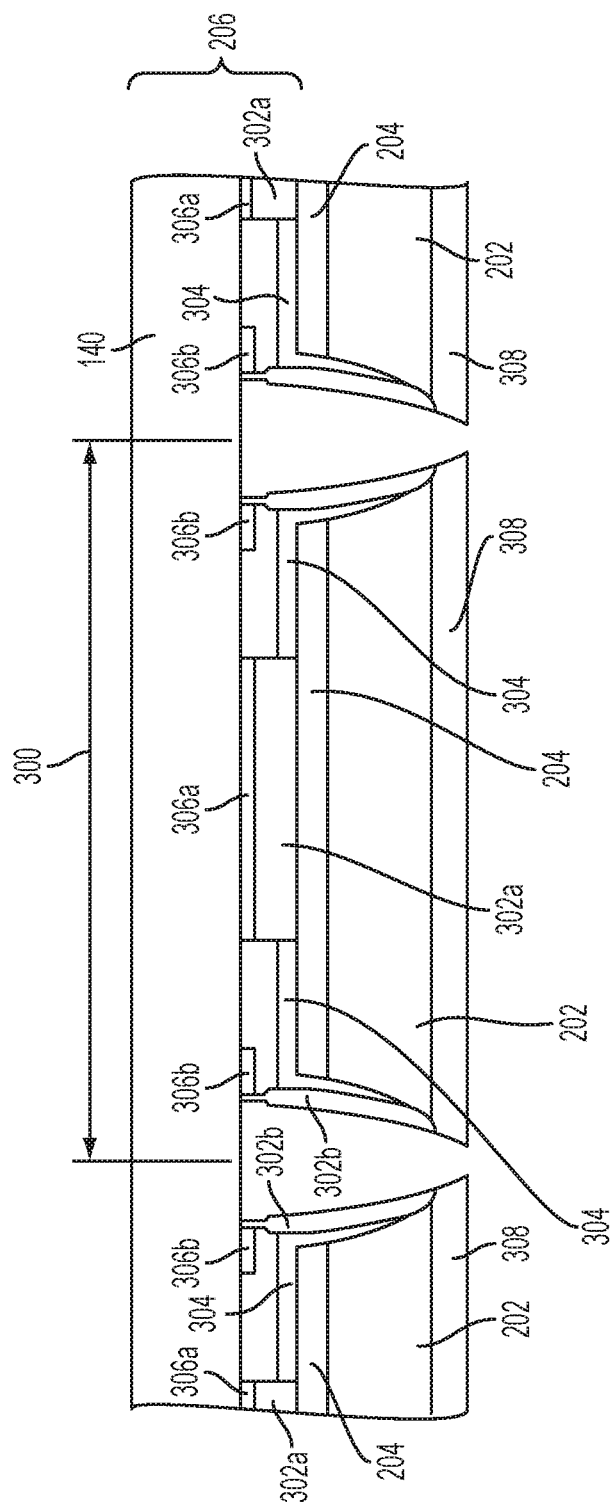
FIG. 3 is a cross-sectional view of a unit cell fabricated with the semiconductor substrate of FIG. 2 in accordance with embodiments.

With reference to FIG. 3, a cross-sectional view of unit cell 300 is provided. As shown in FIG. 3, the unit cell 300 includes respective portions of the absorber layer 202, the separation layer 204 and the contact layer 206. With the respective portion of the contact layer 206, one or more first contacts 302a and one or more second contacts 302b are formed. The first contacts 302a facilitate conduction of the first charged carriers (e.g., signal carriers) from the respective portion of the separation layer 204 to the ROIC 140. The second contacts 302b facilitate conduction of charged carriers (e.g., ground carriers) from the respective portion of the absorber layer 202 to the ROIC 140. The first contacts 302a may be electrically isolated from the second contacts 302b by passivation 304. The direct bond interconnects 306a (e.g., signal interconnects) may interconnect the first contacts 302a and the ROIC 140 and the direct bond interconnects 306b (e.g., ground interconnects) may interconnect the second contacts 302b and the ROIC 140. The unit cell 300 may optionally include an anti-reflection coating 308 positioned along at least a portion of the absorber layer 202 to prevent electro-magnetic energy from being reflected away from the unit cell 300.

Fabrication of the unit cell 300 from semiconductor substrate 200 may involve etching the respective portions of the absorber layer 202, the separation layer 204 and the contact layer 206 from the semiconductor substrate 200 using any suitable etching technique (e.g., wet chemical etching or dry plasma etching). The various layers may be etched to define a pixel area for the unit cell 300 (e.g., for when a unit cell 300 is used as a unit cell in an array of unit cells 300). The respective portions of the contact layer 206 may be etched, for example, to define one or more areas of the semiconductor substrate 200 to be electrically coupled to other electrical and/or electronic circuitry external to the unit cell 300, such as the ROIC 140.

After the respective portions of the absorber layer 202, the separation layer 204 and/or the contact layer 206 have been etched, passivation 304 may be deposited on top of the exposed portions of the unit cell 300. The passivation 304 may include silicon dioxide, silicon nitride, aluminum oxide, hafnium oxide, cadmium telluride or any other suitable material. The passivation 304 may be deposited on the semiconductor substrate 200 via thermal evaporation, molecular beam epitaxy, plasma enhanced chemical vapor deposition, atomic layer deposition or any other suitable technique. After deposition of the passivation 304, portions of the passivation 304 may be removed (e.g., via wet chemical etching or dry plasma etching) in order to expose the remaining portions of the contact layer 206. The passivation 304 may serve to electrically isolate portions of the semiconductor substrate 200.

The first contacts 302a may include metal formed on the respective portions of the contact layer 206 that are not covered by passivation 304 and may include a generally conductive material (e.g., indium, aluminum, silver, copper, gold or other suitable metal) to electrically couple the contact layer 206 to the ROIC 140 through corresponding direct bond interconnects 306a. The first contacts 302a may be formed on the semiconductor substrate 200 via implantation, deposition, epitaxy or any other suitable fabrication technique.

Figure 4:
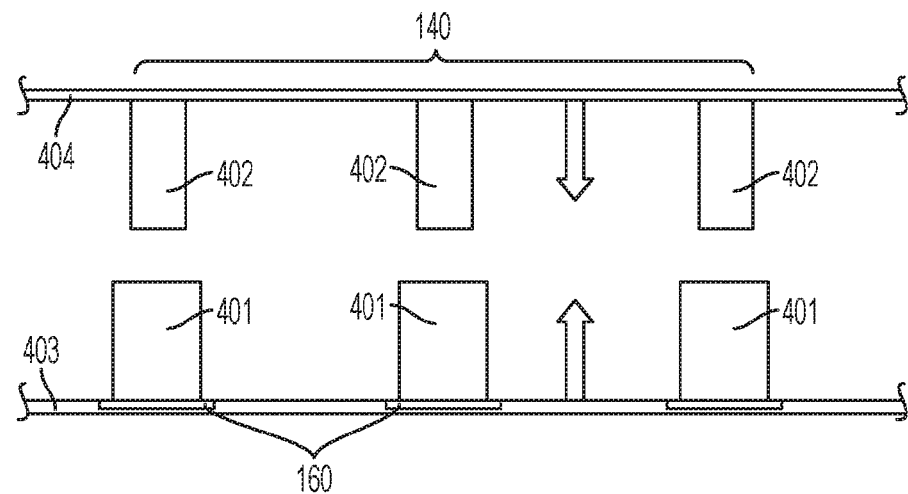
FIG. 4 is a side schematic view illustrating an initial stage of an electro-optical sensor chip assembly assembly.
Figure 5:
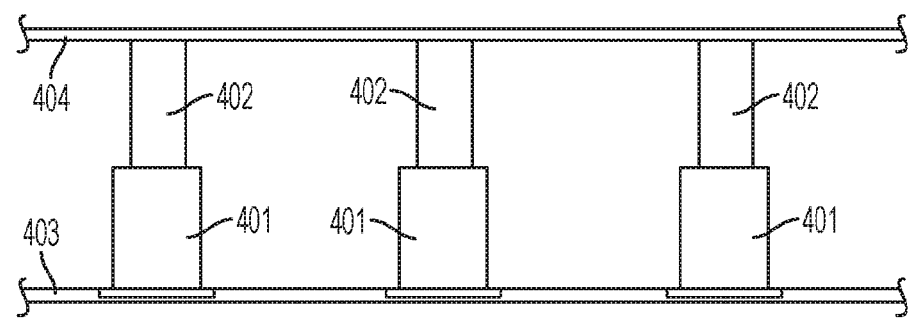
FIG. 5 is a side schematic view illustrating a late stage of an electro-optical sensor chip assembly assembly.

The bonding process for the direct bond interconnects 306a may be conducted on a wafer level or die level. That is, with reference to FIGS. 4 and 5, the direct bond interconnects 306a may be respectively formed of first interconnect posts 401, which may be formed of indium or other similar materials and which extend from the unit cells 160 toward the ROIC 140, and second interconnect posts 402, which extend between distal ends of the first interconnect posts 401 and the ROIC 140. During the bonding processes, the first and second interconnect posts 401 and 402 are hybridized by a pressurization or squeezing of detector wafer 403 and ROIC wafer 404. While such use of wafers and wafer level processing allows for efficient manufacturing, the pressurization and squeezing of the detector wafer 403 and the ROIC wafer 404 can result in the first and second interconnect posts 401 and 402 becoming cold welded and in the application of shear stresses to the first and second interconnect posts 401 and 402. These shear stresses cause some component shifting which is a source of positional error. This movement requires additional measurements of the pixel shifting introducing positional errors and loss of positional knowledge.

To this end, with reference to FIGS. 6A, 6B, 6C, 6D and 7, an electro-optical sensor chip assembly 601 is provided with integrated circuit (e.g., ROIC) and detector components that are similar to those described above. That is, the electro-optical sensor chip assembly 601 includes a ROIC 602, which is similar to the ROIC 140 described above, or another similar integrated circuit assembly, a shim 6021 disposed adjacent to the ROIC 602, a detector 603, which is similar to the detection device 120 described above, and an interconnect layer 604. At least at an initial stage, the detector 603 includes a substrate 6032 and an array of pixels 6033. The substrate 6032 includes a buffer layer 6034 and a pixel layer 6036. The array of pixels 6033 is disposed in the pixel layer 6036. The interconnect layer 604 is interposed between the ROIC 602 and the pixel layer 6036 and includes interconnect posts 6041. The interconnect posts 6041 may be formed by the processes described above with reference to FIGS. 4 and 5 and thus may include first interconnect posts 610 (e.g., indium interconnects) and second interconnect posts 611. In any case, the interconnect posts 6041 may exhibit deformation due to shear stresses and positional shifts with respect to their corresponding pixels 6033 resulting from the pressurization and squeezing processes of the ROIC 602 to the detector 603. In any case, the interconnect posts 6041 are respectively extendible to the ROIC 602 from the pixels 6033.

In accordance with embodiments, the buffer layer 6034 may include infrared transparent semiconductor materials such as cadmium telluride (CdTe), cadmium selenide (CdSe), zinc selenide (ZnSe) or zinc telluride (ZnTe) and the pixel layer 6036 may include, for example, an n-type mercury cadmium tellurium (HgCdTe) absorber material. Meanwhile, each of the pixels 6033 may include a p-type cap layer 612, a contact metal layer 613 interposed between the p-type cap layer 612 and the corresponding interconnect post 6041, a passivation material layer 614 surrounding the contact metal layer 613 and an overglass layer (not shown) disposed on the passivation material layer 614 and the contact metal layer 613.

Figure 6B:
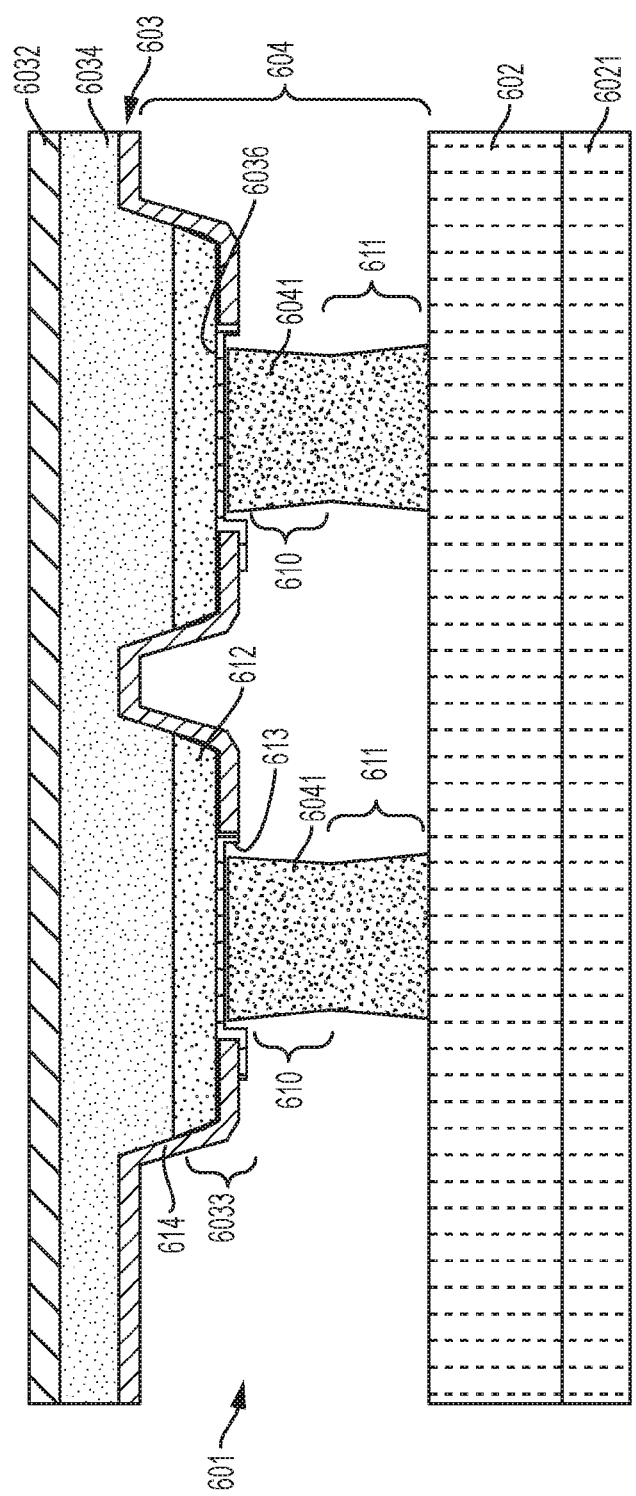
FIG. 6B is a cross-sectional view of an electro-optical sensor chip assembly at an intermediate assembly stage in accordance with embodiments.
Figure 6C:
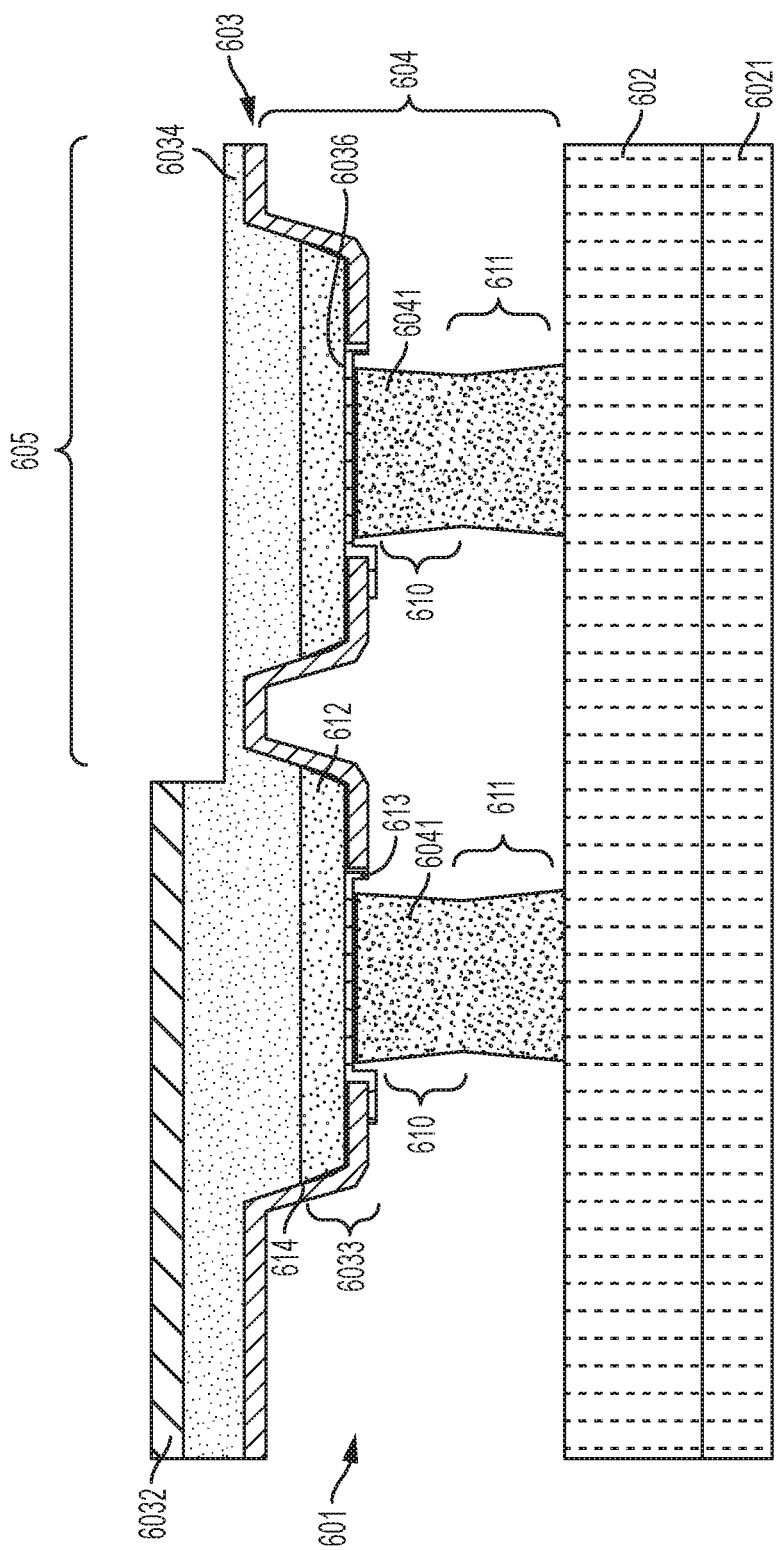
FIG. 6C is a cross-sectional view of an electro-optical sensor chip assembly at a late assembly stage in accordance with embodiments.
Figure 6D:
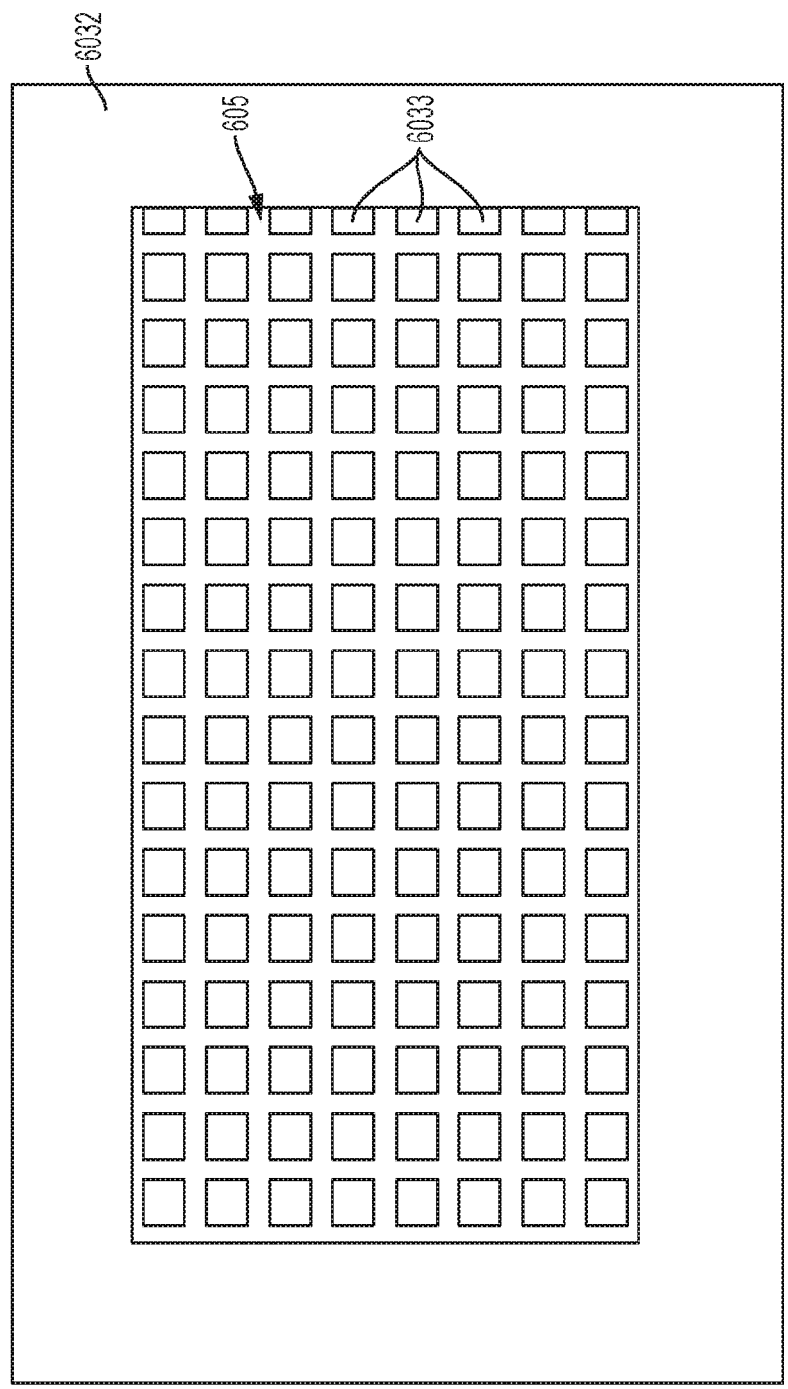
FIG. 6D is a plan view of pixels of a pixel layer of the electro-optical sensor chip assembly of FIG. 6A.

In accordance with embodiments, respective portions of the substrate 6032 and the buffer layer 6034 are formed to define at least one or more direct view windows 605. As shown in FIGS. 6C and 6D, each direct view window 605 extends through the substrate 6032 and the buffer layer 6034 and is generally defined at or very close to a planar location of a corresponding one or more of the pixels 6033. Here, the planar location is defined along X- and Y-axes where the Z-axis is defined along a depth-wise dimension of the substrate 6032 and the buffer layer 6034 (i.e., top-to bottom in the images of FIGS. 6A, 6B and 6C). In accordance with further embodiments, the remaining portions of the buffer layer 6034 following the formation of the direct view windows 605 is formed to be sufficiently thin such that visible wavelength light propagating from the direct view window 605 is able to penetrate to the one or more of the pixels 6033. Thus, at least one of the pixels 6033 is visible (with magnification) through the direct view window 605 during what is effectively the direct read pixel alignment procedures.

That is, the direct read pixel alignment procedures can make use of visible wavelength light to aid in direct readings of pixel locations without multiple transfers or use of infrared measurement equipment. This can in turn be used to facilitate pixel alignment for the electro-optical sensor chip assembly 601. Moreover, since the wavelength of visible wavelength light is more than 10× shorter than the wavelength of other forms of the electromagnetic spectrum that could be transmitted through the substrate material, such as infrared wavelength light, an accuracy of the direct read pixel alignment procedures facilitated by the direct view window 605 is significantly improved as compared to the potential accuracy of infrared pixel detection using infrared light.

Figure 7:
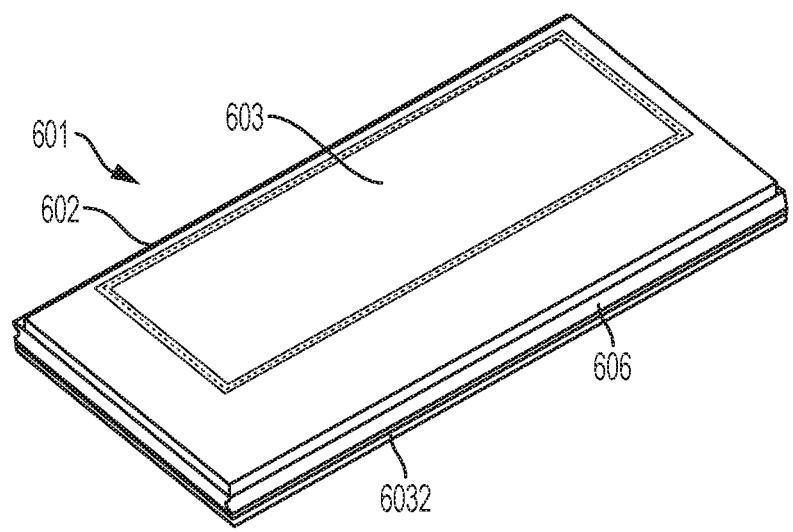
FIG. 7 is a perspective view of an electro-optical sensor chip assembly in accordance with embodiments.

In accordance with embodiments and, as shown in FIG. 7, the electro-optical sensor chip assembly 601 may include or be formed to define sidelong handling vee grooves 606. The sidelong handling vee grooves 606 extend along outer edges of the substrate 6032 and aid in the handling and movement of the electro-optical sensor chip assembly 601 so that the electro-optical sensor chip assembly 601 can be placed in a detection module assembly (see, e.g., the electro-optical module assembly 1301 of FIG. 13 to be described below) without risking damage to the ROIC 602 or the detector 603.

Figure 10:
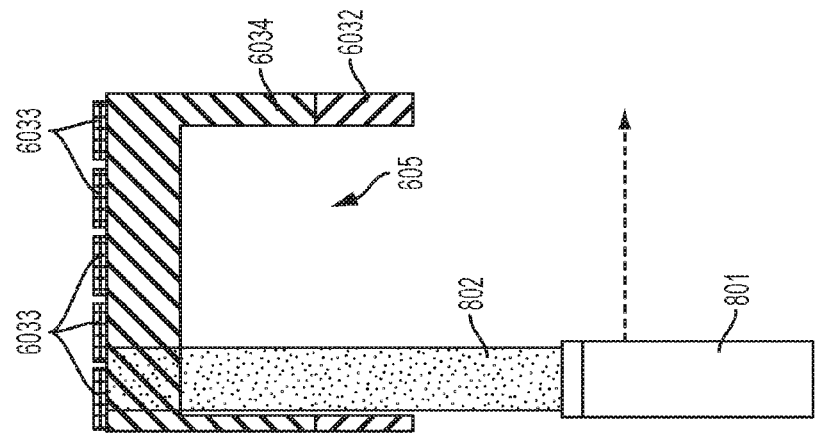
FIG. 10 is a side view of a direct view window and a group of corresponding pixels of an electro-optical sensor chip assembly in accordance with embodiments.
Figure 9:
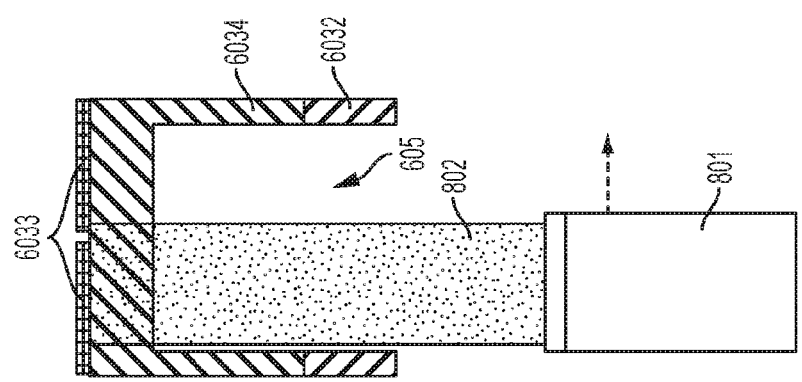
FIG. 9 is a side view of a direct view window and a group of offset corresponding pixels of an electro-optical sensor chip assembly in accordance with embodiments.
Figure 8:
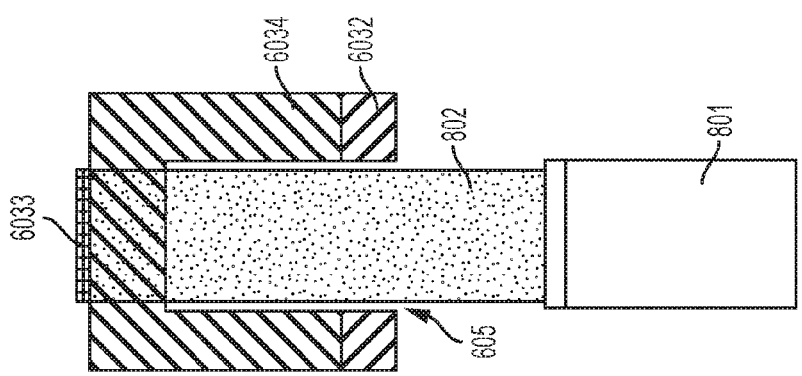
FIG. 8 is a side view of a direct view window and a corresponding pixel of an electro-optical sensor chip assembly in accordance with embodiments.

With reference to FIGS. 8-10, embodiments of the direct view window 605 will now be described.

As shown in FIG. 8, each individual direct view window 605 may be provided with a 1:1 correspondence with an individual pixel 6033. In such cases, the direct view window 605 may be generally similar in size as or slightly larger than the corresponding pixel 6033 (or area of pixels is addressed later) and may be positioned at a substantially similar planar location as the pixel 6033. Here, the slightly larger size of the direct view window 605 may be employed to account for slight positional misalignments of the direct view window 605 and the pixel 6033 as well as shearing or shifting of the corresponding interconnect post 6041 as well as accommodating a number of optical measurement devices being used. A scope 801, such as a high precision z-scope, may be provided to aid in the viewing and direct read alignment of the pixel 6033 through the direct view window 605 using visible wavelength light 802. In accordance with embodiments, the direct read alignment of the pixel 6033 is configured and executed to find and locate pixel centers based on contrasts with pixel edges.

As shown in FIG. 9, each individual direct view window 605 may be provided with a 1:2-1:4 offset correspondence with multiple pixels 6033. In such cases, the direct view window 605 may be larger in size as each of the multiple pixels 6033 and may be positioned at an offset planar location (e.g., centered over edges or corners). As above, a scope 801, such as the high precision z-scope, may be provided to aid in the viewing and direct read alignment of the multiple pixels 6033 through the direct view window 605 using visible wavelength light 802. In accordance with embodiments, the direct read alignment of the multiple pixels 6033 is configured and executed to find and locate pixel centers based on contrasts with pixel edges.

As shown in FIG. 10, each individual direct view window 605 may be provided with a 1:4+ correspondence with multiple pixels 6033. In such cases, the direct view window 605 may be substantially larger in size as each of the multiple pixels 6033. The wider window configuration allows for a higher magnification viewing scope and provides more pixel edges to improve the statistical significance of the measurements thereby improving measurement knowledge. As above, a scope 801, such as the high precision z-scope, may be provided to aid in the viewing and direct read alignment of the multiple pixels 6033 through the direct view window 605 using visible wavelength light 802. In accordance with embodiments, the direct read alignment of the multiple pixels 6033 is configured and executed to find and locate pixel centers based on contrasts with pixel edges.

Although the embodiments of FIGS. 8-10 are described with reference to a single pixel 6033 or to multiple pixels 6033 generally grouped together, it is to be understood that this is not necessary and that other embodiments exist. For example, in the case of FIG. 8, multiple direct view windows 605 can be provided to facilitate performance of multiple direct read pixel alignments at multiple locations or, for example, 2/3 dimensional arrays of the electro-optical sensor chip assembly 601.

Figure 11:
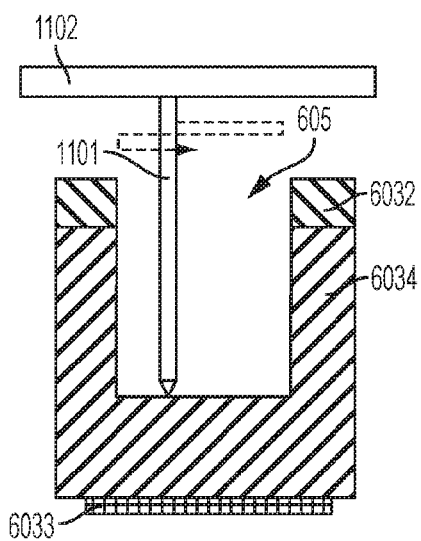
FIG. 11 is a side schematic view illustrating a diamond point turning (DPT) machining method for forming a direct view window in an electro-optical sensor chip assembly in accordance with embodiments.
Figure 12:
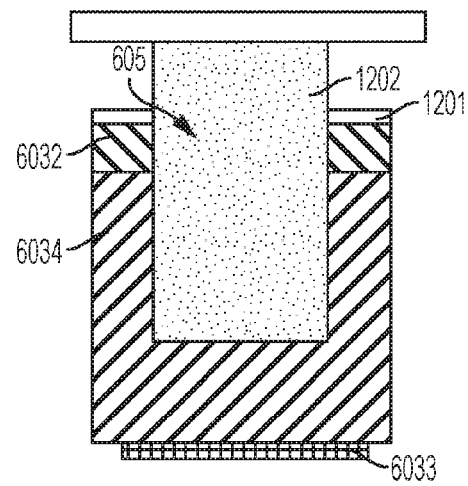
FIG. 12 is a side schematic view illustrating a chemical etching method or a dry etching method for forming a direct view window in an electro-optical sensor chip assembly in accordance with embodiments.

In accordance with embodiments and, with reference to FIGS. 11 and 12, the direct view window 605 may be formed in the substrate 6032 and the buffer layer 6034 by at least one of diamond point turning (DPT) machining processes (see FIG. 11) or other similar machining processes and/or by chemical or dry etching (see FIG. 12) or other similar etching processes. For those cases in which DPT machining processes are employed and, as shown in FIG. 11, a DPT head 1101 is positioned and controlled relative to the substrate 6032 and the buffer layer 6034 by servo elements of a DPT machine 1102. The DPT head 1101 iteratively removes material from the substrate 6032 and then the buffer layer 6034.

Where chemical etching processes are employed to form the direct view window 605 and, as shown in FIG. 12, portions of the substrate 6032 that are outside of the region where the direct view window 605 is to be formed are masked by mask 1201 and the resulting exposed portion of the substrate 6032 and then the buffer layer 6034 is exposed to an appropriate etchant 1202 or similar etching process. The dry etching process incorporates particles (ions) or gas impingement into portions of the substrate 6032 and buffer layer 6034 for material removal to form a direct view window 605.

Although the DPT machining processes and etching processes are described above as being employed separately, it is to be understood that they may be employed in combination as well. For example, as shown in the sequence of FIGS. 6A, 6B and 6C, outer layers of the substrate 6032 may be removed by way of DPT machining processes to achieve the thinned substrate 6032 condition of FIG. 6B. Subsequently, the interior layers of the substrate 6032 and the buffer layer 6034 can be more carefully removed by way of an etching methodology to insure that no portion of the pixel 6033 is undesirably removed to form the direct view window 605 of FIG. 6C.

Figure 13:
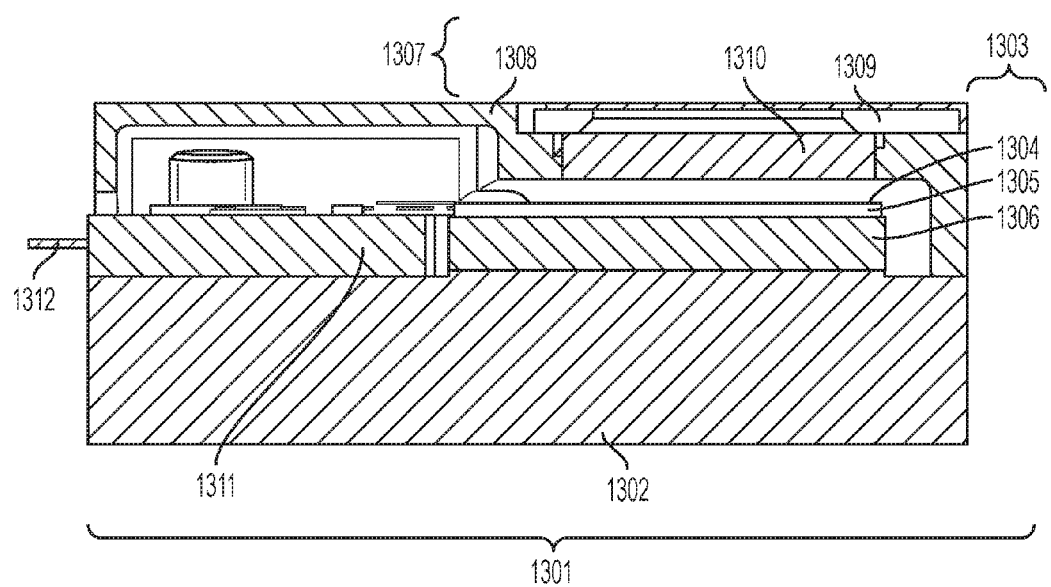
FIG. 13 is a section view of an electro-optical detector in accordance with embodiments.

With reference to FIG. 13, an electro-optical module assembly 1301 may include a pedestal 1302 and a sensor chip assembly 1303. This sensor chip assembly 1303 includes an electro-optical detector element 1304 as described above, a ROIC as described above 1305 and a supporting shim 1306. The pedestal 1302 may further include an optical element assembly 1307, which is formed to define an optical element (e.g., a filter) 1310 that is secured into a bezel 1308, with a defining image aperture 1309. In addition, the pedestal 1302 can support a rigid flex assembly 1311 with a varied number of flex cables 1312 or a motherboard assembly for electrical interconnections. The electro-optical module assembly 1301 may be assembled by characterization of a position of the optical element 1310 relative to the pedestal 1302, a conducting of direct read pixel alignment operations of the electro-optical detector element 1304, a disposition of the electro-optical detector element 1304 on the pedestal 1302 and an alignment (e.g., three-dimensional alignment) of the electro-optical detector element 1304 relative to the optical element (e.g., the filter) 1310 based on the characterized position and results of the direct read pixel alignment operations. The assembly may further include a disposition of another detector array 1303 or on the pedestal 1302 or the alignment of another electro-optical module assembly 1301 using the alignment feature and detector pixels based on results of the direct read pixel alignment operations.

In accordance with embodiments, the assembly of the electro-optical detector 1301 may be completed with substantially increased accuracy where the electro-optical detector element 1304 has been subject to direct read pixel alignment operations.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. An electro-optical sensor chip assembly (SCA), comprising:
    an integrated circuit (IC);
    a detector comprising a substrate, a buffer layer, a pixel layer and an array of pixels disposed in the pixel layer; and
    an interconnect layer interposed between the IC and the pixel layer and comprising cold welded interconnect posts respectively extendible to the IC from the pixels,
    wherein the detector is penetrable by visible wavelength light propagating from a direct view window formed in the substrate and the buffer layer to one or more of the pixels.

2. The electro-optical SCA according to claim 1, further comprising sidelong handling grooves.

3. The electro-optical SCA according to claim 1, wherein the buffer layer comprises semiconductor materials.

4. The electro-optical SCA according to claim 1, wherein the pixel layer comprises semi-conductor materials.

5. The electro-optical SCA according to claim 1, wherein each pixel comprises:
    an n-type absorber;
    a p-type cap;
    contact metal interposed between the p-type cap and a corresponding interconnect post; and
    passivation material surrounding the contact metal.

6. A method of forming an electro-optical SCA, comprising:
- assembling a detector having a substrate, a buffer layer, a pixel layer and an array of pixels disposed in the pixel layer;
- interposing an interconnect layer between an integrated circuit (IC) and the pixel layer;
- hybridizing the IC and the detector whereby interconnect posts respectively extendible to the IC from the pixels are cold welded;
- forming a direct view window in the substrate and the buffer layer at a location of one or more of the pixels; and
- propagating visible wavelength light through the detector from the direct view window to the one or more of the pixels.

7. The method according to claim 6, further comprising handling the electro-optical detector at sidelong handling grooves.

8. The method according to claim 6, wherein the buffer layer comprises semiconductor materials.

9. The method according to claim 6, wherein the pixel layer comprises semi-conductor materials.

10. The method according to claim 6, wherein each pixel comprises:
- an n-type absorber;
- a p-type cap;
- contact metal interposed between the p-type cap and a corresponding interconnect post; and
- passivation material surrounding the contact metal.

11. The method according to claim 6, wherein the forming of the direct view window comprises diamond point turning (DPT).

12. The method according to claim 6, wherein the forming of the direct view window comprises chemical or dry etching processes.

13. The method according to claim 6, wherein the forming of the direct view window comprises:
- diamond point turning (DPT) through exterior layers of the substrate; and
- chemical etching through interior layers of the substrate and the buffer layers.

14. A method of assembling an electro-optical detector, the method comprising:
- characterizing a position of an optical element relative to a pedestal;
- conducting direct read pixel alignment of an electro-optical detector element;
- disposing the electro-optical detector element on the pedestal; and
- aligning the electro-optical detector element relative to the optical element based on the characterized position and the direct read pixel alignment.

15. The method according to claim 14, wherein the pedestal comprises:
- a bezel; and
- an optical element assembly formed to define an optical element and secured into the bezel with a defining image aperture.

16. The method according to claim 15, wherein the pedestal is supportive of a rigid flex assembly with flex cables 1312.

17. The method according to claim 14, wherein the aligning comprises planar alignment of the electro-optical SCA relative to the optical element.

18. The method according to claim 14, wherein the optical element comprises a filter and further comprising aligning the electro-optical detector element relative to the filter based on the characterized position and the direct read pixel alignment.

* * * * *